(12) United States Patent
Shields et al.

(10) Patent No.: US 6,500,768 B1
(45) Date of Patent: Dec. 31, 2002

(54) METHOD FOR SELECTIVE REMOVAL OF ONO LAYER

(75) Inventors: Jeffrey A. Shields, Sunnyvale, CA (US); Jiahua Huang, San Jose, CA (US); Jean Yee-Mei Yang, Sunnyvale, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 21 days.

(21) Appl. No.: 09/699,531

(22) Filed: Oct. 30, 2000

(51) Int. Cl.[7] .............................................. H01L 21/302
(52) U.S. Cl. ...................... 438/738; 438/737; 438/723; 438/724
(58) Field of Search ................. 438/653, 656, 438/660, 687, 586, 652, 758, 710, 714, 715, 723, 724, 727, 735, 737, 738

(56) References Cited

U.S. PATENT DOCUMENTS

| | | | | |
|---|---|---|---|---|
| 5,209,803 A | * | 5/1993 | Powell | 156/345 |
| 5,387,312 A | * | 2/1995 | Keller et al. | 156/662 |
| 5,413,670 A | * | 5/1995 | Langan et al. | 134/1.2 |
| 6,346,442 B1 | * | 2/2002 | Aloni et al. | 438/258 |

FOREIGN PATENT DOCUMENTS

JP  60246675  * 12/1985

OTHER PUBLICATIONS

V.K. Rathi, et al. "The dependence of etch rate of photo CVD silicon nitride films on NH4F content in buffered HF" Microelectronics Journal vol. 26, No. 6, p. 563–567 (Sep. 1995).(abstract).*
U.S. patent application Ser. No. 09/574,574: "A Low Power Isotropic Etch for Removing Nitride Stringers"; Filed: May 17, 2000; Attorney Docket No. F0044.

* cited by examiner

Primary Examiner—Caridad Everhart
(74) Attorney, Agent, or Firm—Eschweiler & Associates, LLC (57) ABSTRACT

A process for fabricating a semiconductor device, the process includes providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer. The process further includes, performing an isotropic etch on the oxide-nitride-oxide layer to remove a portion of the oxide-nitride-oxide layer.

6 Claims, 5 Drawing Sheets

METHOD FOR SELECTIVE REMOVAL OF ONO LAYER

FIELD OF THE INVENTION

This invention relates generally to a process for fabricating a semiconductor device having an oxide-nitride-oxide layer and, more particularly, to a process for removing a portion of the oxide-nitride-oxide layer using an isotropic etch.

BACKGROUND

Semiconductor devices are currently in widespread use in a variety of electronic devices, such as computers, stereos, telephones, cameras, engine control units, and the like. Semiconductor devices include, but are not limited to, central processing units, non-volatile memory devices, and digital signal processors. One type of semiconductor device, non-volatile memory devices, are currently in use in electronic devices that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells within these memory device can be programmed and erased electrically. However, Flash EEPROM devices enable the erasing of large blocks of memory cells using a single electrical current pulse.

Product development efforts in non-volatile memory device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode.

One important dielectric material for the fabrication of a flash EEPROM device is an oxide-nitride-oxide (ONO) layer. The ONO layer includes a first oxide layer, a nitride layer overlying the first oxide layer, and a second oxide layer overlying the nitride layer. The ONO layer may serve as either a charge storage layer or an insulating layer in the flash EEPROM device. In one example, the ONO layer serves as a charge storage layer. During programming, electrical charge is transferred from the substrate to the nitride layer in the ONO layer. Voltages are applied to the gate and drain creating vertical and lateral electric fields, which accelerate the electrons along the length of the channel. As the electrons move along the channel, some of them gain sufficient energy to jump over the potential barrier of the first oxide layer and become trapped in the nitride layer. Electrons are trapped near the drain region because the electric fields are the strongest near the drain. Reversing the potentials applied to the source and drain will cause electrons to travel along the channel in the opposite direction and be injected into the nitride layer near the source region. Because the nitride layer is not electrically conductive, the charge introduced into the nitride layer tends to remain localized. Accordingly, depending upon the application of voltage potentials, electrical charge can be stored in regions within a single continuous nitride layer. In one example, the ONO layer serves as an insulating layer for a floating gate structure within a flash EEPROM device.

Non-volatile memory designers have taken advantage of the localized nature of electron storage within a silicon nitride layer and have designed memory devices that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

In addition to non-volatile memory, such as a flash EEPROM, other semiconductor devices may include ONO layers as well. ONO layers can serve many different purposes, such as, for example an insulator or as a charge storage layer in a semiconductor device. While the recent advances in semiconductor fabrication technology have enabled semiconductor device designers to create much smaller semiconductor devices, numerous challenges exist in the fabrication of material layers within these devices. In particular, fabricating an ONO layer within a semiconductor device presents several challenges. As the size of features within semiconductor devices has decreased, so has the thickness of the ONO layers. Selective removal of a thin ONO layer, that is an ONO layer of less than 1000 angstroms in thickness, has becomes increasingly difficult with conventional etching techniques, such as anisotropic etching.

Figure 12:
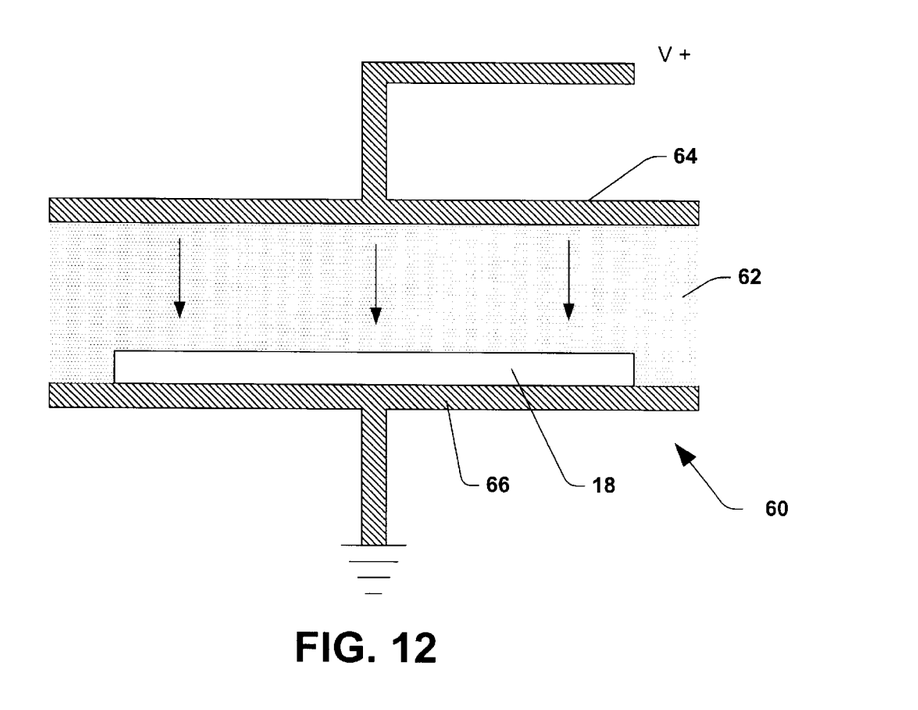
FIG. 12 illustrates, in cross section, a conventional anisotropic etch chamber.

As illustrated in FIG. 12, anisotropic etching requires the use of an anisotropic etch chamber 60. A semiconductor device 18 is placed upon a negative plate 66 within the anisotropic etch chamber 60 between a positive plate 64 and the negative plate 66. The negative plate 66 is grounded. An RF voltage V+ is applied to the positive plate 64 to excite gases within the anisotropic etch chamber 60 and convert the gases into high energy plasma 62. Because the semiconductor device 18 is placed on the negative plate 66, the semiconductor device 18 experiences a DC bias voltage of V+, which is typically in the range of 100 to 1000 volts. The high energy plasma 62, created by the DC bias voltage of V+ is accelerated from the positive plate 64 to the negative plate 66 and into the semiconductor device 18 at a relatively high rate of speed. Anisotropic etching can typically penetrate as much as 100 angstroms or more into the semiconductor device, and in particular into an ONO layer within a semiconductor device. If the ONO layer within a semiconductor device is thin, that is less than 1000 angstroms, anisotropic etching can cause damage to the semiconductor substrate beneath the ONO layer. Accordingly, advances in processes for fabricating a semiconductor device having an oxide-nitride-oxide layer and, more particularly, in processes for removing a portion of the oxide-nitride-oxide layer, are necessary.

BRIEF SUMMARY

According to a first aspect of the present invention, a process for fabricating a semiconductor device is provided. The process includes providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer. The process further includes, performing an isotropic etch on the oxide-nitride-oxide layer to remove a portion of the oxide-nitride-oxide layer.

According to another aspect of the present invention, a process for fabricating a semiconductor device is provided. The process includes providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer. The process further includes, performing a wet etch on the second oxide layer, wherein the wet etch is highly selective to oxides, and performing an isotropic etch on the nitride layer.

According to another aspect of the present invention, a process for fabricating a semiconductor device is provided. The process includes providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer. The process further includes, performing a first isotropic etch on the second oxide layer, and performing a second isotropic etch on the nitride layer.

According to another aspect of the present invention, a process for fabricating a semiconductor device is provided. The process includes providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer. The process further includes performing an isotropic etch on the nitride layer.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE PRESENTLY PREFERRED EMBODIMENTS

Shown in FIGS. 1–8, in cross-section, are process steps for the fabrication of a semiconductor device 18 having an oxide-nitride-oxide (ONO) layer 24, in accordance with one preferred embodiment. Semiconductor device 18 may include, but is not limited to, a central processing unit, a non-volatile memory device, such as a memory device 20, and a digital signal processor.

Figure 1:
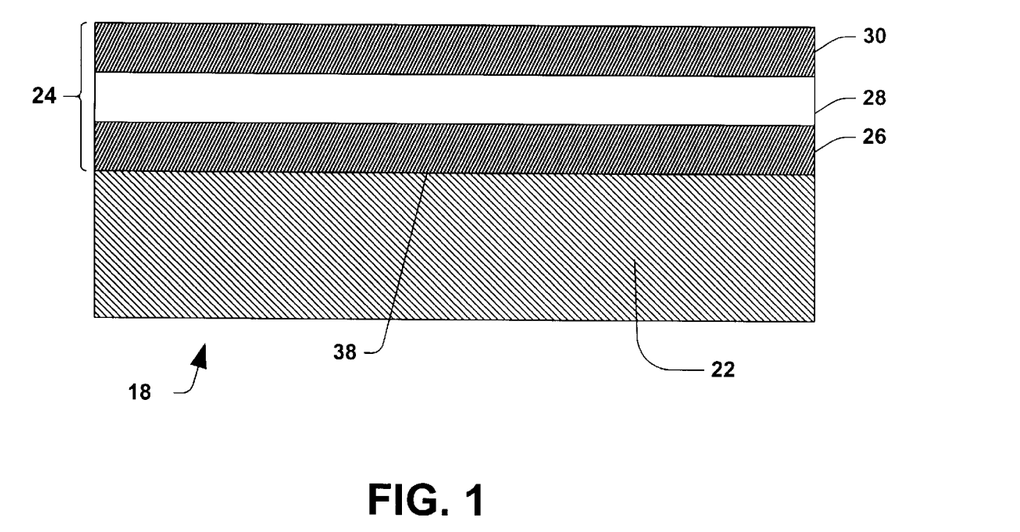
FIGS. 1–8 illustrate, in cross-section, process steps for the fabrication of a semiconductor device having an ONO layer, in accordance with one preferred embodiment of the invention.

Referring to FIG. 1, ONO layer 24 is formed overlying a principal surface 38 of semiconductor substrate 22. Preferably, semiconductor substrate 22 is a single crystal silicon substrate. Principal surface 38 is previously processed and cleaned to remove debris and native oxides. ONO layer 24 includes a first oxide layer 26, a nitride layer 28 overlying the first oxide layer 26, and a second oxide layer 30 overlying the nitride layer 28. In one embodiment, first oxide layer 26 comprises silicon dioxide, nitride layer 28 comprises silicon nitride, and second oxide layer 30 comprises silicon dioxide. First oxide layer 26 is formed overlying the semiconductor substrate 22. Preferably, first oxide layer 26 has a thickness of about 50 to about 150 angstroms and, more preferably, a thickness of about 80 angstroms. After forming first oxide layer 26, nitride layer 28 is deposited overlying first oxide layer 26, as illustrated in FIG. 1. Preferably, nitride layer 28 is formed by reacting ammonia $NH_3$ with either dichlorosilane ($SiCl_2H_2$) or silane ($SiH_4$). Preferably, nitride layer 28 has a thickness of about 50 to about 200 angstroms and, more preferably, an initial thickness of about 100–175 angstroms. After depositing nitride layer 28, second oxide layer 30 is formed overlying nitride layer 28, as illustrated in FIG. 1. As second oxide layer 30 is formed overlying nitride layer 28, nitride layer 28 decreases in thickness to a final thickness of about 30 to about 170 angstroms and, more preferably, a final thickness of about 50–100 angstroms. Preferably, second oxide layer 30 has a thickness of about 50 to about 150 angstroms and, more preferably, a thickness of about 80–95 angstroms. While general ranges for the thicknesses of first oxide layer 26, nitride layer 28, and second oxide layer 30 have been stated above, first oxide layer 26, nitride layer 28, and second oxide layer 30 may have any thickness required to form any semiconductor device 18. Additionally, while the above process describes a reduction in thickness of nitride layer 28, second oxide layer 30 may just be deposited onto nitride layer 28 without reducing the thickness of nitride layer 28. First oxide layer 26 and second oxide layer 30 may include any type of oxide formed by any method, such as, a thermal oxide, a low-pressure chemical vapor deposition oxide, a plasma enhanced chemical vapor deposition oxide, a rapid thermal oxide, and a nitrided oxide. Nitride layer 28 may include any type of nitride formed by any method, such as, a silicon-rich nitride, a nitrogen-rich nitride, low-pressure chemical vapor deposition nitride, and a plasma enhanced chemical vapor deposition nitride.

Figure 2:
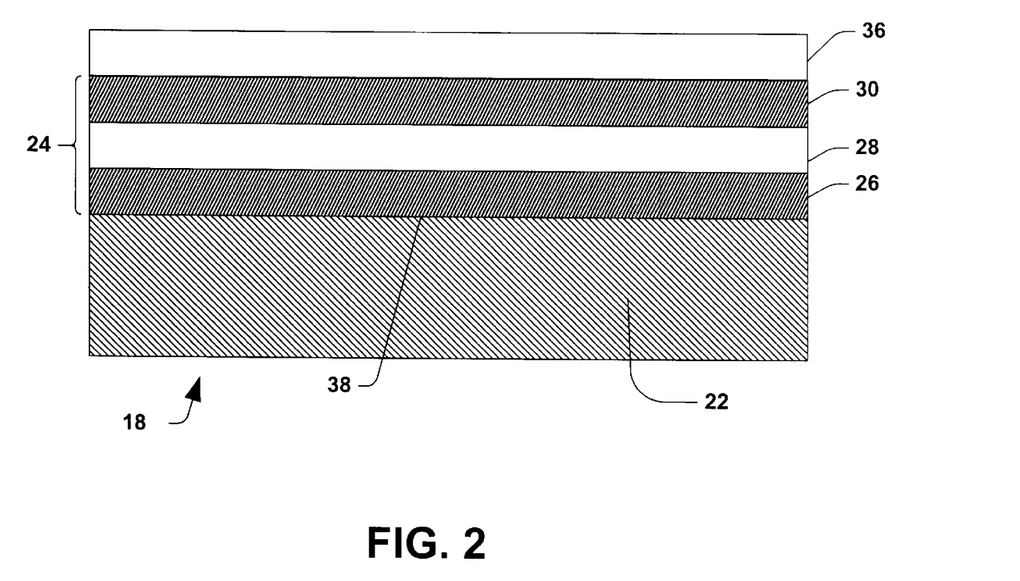
Figure 3:
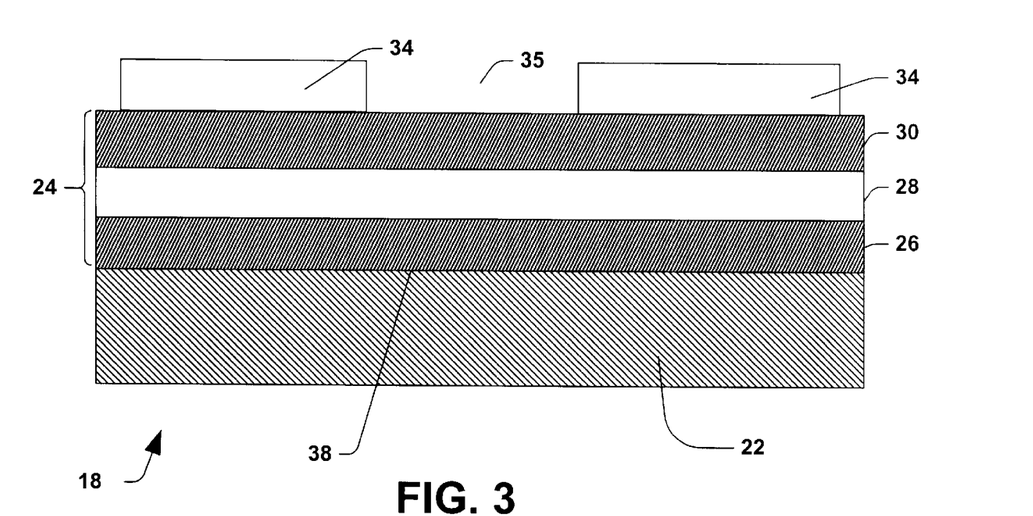

Once ONO layer 24 has been formed, resist layer 36 is deposited overlying ONO layer 24, as illustrated in FIG. 2. Resist layer 36 comprises any known photoresist or hard mask. Preferably, resist layer 36 has a thickness of about 4,000 to about 10,000 angstroms and, more preferably, a thickness of about 5,000–6,000 angstroms. Upon depositing resist layer 36, resist layer 36 is patterned, as illustrated in FIG. 3. The patterning of resist layer 36 forms patterned resist layer 34 having window openings 35 formed through resist layer 36. In one embodiment, resist layer 36 is patterned by exposing resist layer 36 to a light source, such as an ultra-violet light source.

Figure 4:
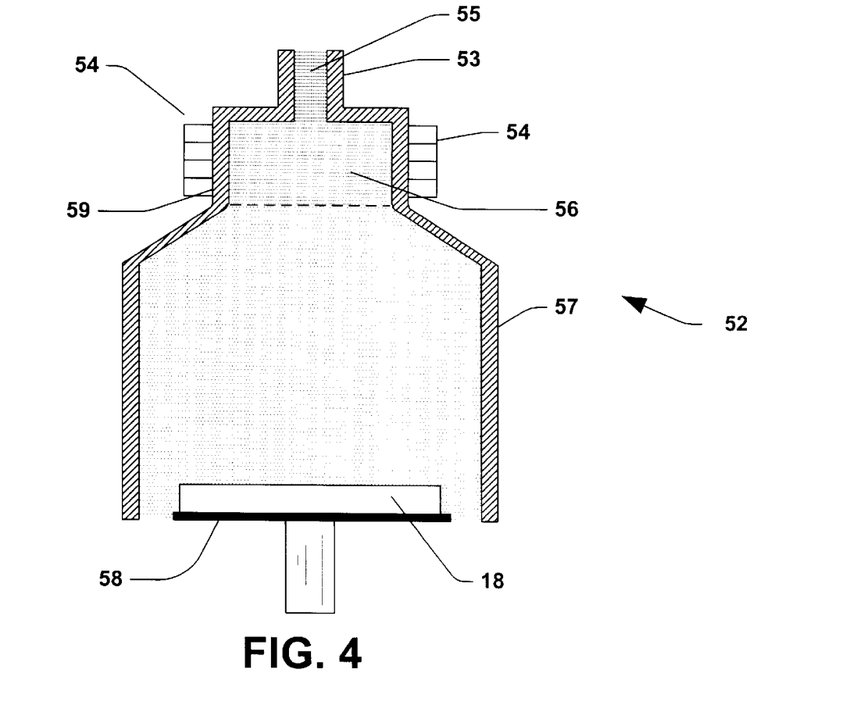

After patterning resist layer 36 and forming patterned resist layer 34, an isotropic etch is performed on the ONO layer 24 to remove a portion of the ONO layer 24, as illustrated in FIG. 4. Patterned resist layer 34 is used as an etch mask to etch only unmasked portions of ONO layer 24. The isotropic etch is performed in an isotropic etch chamber 52, such as the Lam 4520i isotropic etch chamber, manufactured by Lam Research Corporation of 4650 Cushing Parkway in Fremont, Calif. 94538. Isotropic etch chamber 52 includes plasma chamber 59 for converting a gas 55 into a low energy plasma 56, a gas inlet 53 for allowing the gas 55 to enter plasma chamber 59, an RF coil 54 surrounding plasma chamber 59 for converting the gas 55 to low energy plasma 56, a device chamber 57 for surrounding the semiconductor device 18, and a paddle 58 located within device chamber 57 for placing the semiconductor device 18 upon.

In operation, gas 55 enters plasma chamber 59 at gas inlet 53. Once inside plasma chamber 59, gas 55 is converted in low energy plasma 56 by operating RF coil 54 at a power of between about 50 W and 100 W. The energy in RF coil 54 is sufficient to convert gas 55 to low energy plasma 56. As defined herein, low energy plasma 56 is plasma that is created using a power of less than 200 W. The low energy plasma 56 is then diffused into the larger device chamber 57, whereupon the semiconductor device 18, and more particularly, the ONO layer 24 within the semiconductor device 18 is isotropically etched. By surrounding plasma chamber 59 with RF coil 54, and by placing the semiconductor device 18 in the device chamber 57, which is separate and apart from plasma chamber 59, the DC bias voltage that the semiconductor device 18 experiences approaches zero. Because the DC bias voltage that the semiconductor device 18 experiences approaches zero, the low energy plasma 56 comes into contact with semiconductor device 18 at a relatively low rate of speed in comparison to high energy plasma 62 which is created in an anisotropic etch chamber, such as anisotropic etch chamber 60. Because the low energy plasma 56 created in isotropic etch chamber 52 comes into contact with semiconductor device 18 at a relatively low rate of speed, the isotropic etch performed by the isotropic etch chamber 52 is able to selectively remove a portion of ONO layer 24 from semiconductor device 18. In one embodiment, the isotropic etch penetrates and removes no more than 40 angstroms of thickness from ONO layer 24.

Figure 5:
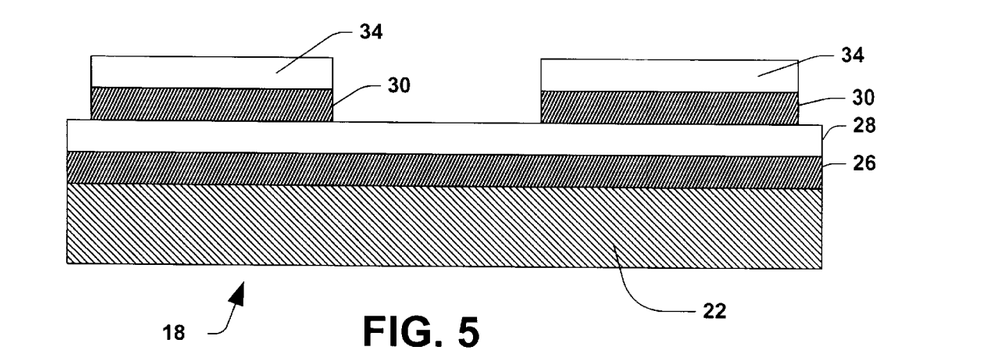

In one embodiment, the isotropic etch is performed on the second oxide layer 30 to selectively remove the unmasked portion of the second oxide layer 30, as illustrated in FIG. 5. In one embodiment, gas 55 includes fluorine gas to selectively remove the unmasked portion of second oxide layer 30. The fluorine gas is converted to inductively coupled fluorine containing low energy, or low damage, plasma 56. A power of between about 50 W and 100 W is applied to the RF coil 54 and the paddle 58 is heated to a temperature of between about 50° C. and about 100° C. In one embodiment, gas 55 includes $NF_3$ and Helium to selectively remove the unmasked portion of second oxide layer 30. Preferably, gas 55 includes between about 40 and 80 sccm of $NF_3$ and between about 200 and 600 sccm of Helium at a pressure of between about 600 and 1000 mT, and more preferably about 60 sccm of $NF_3$ and about 400 sccm of Helium at a pressure of about 800 mT.

Figure 6:
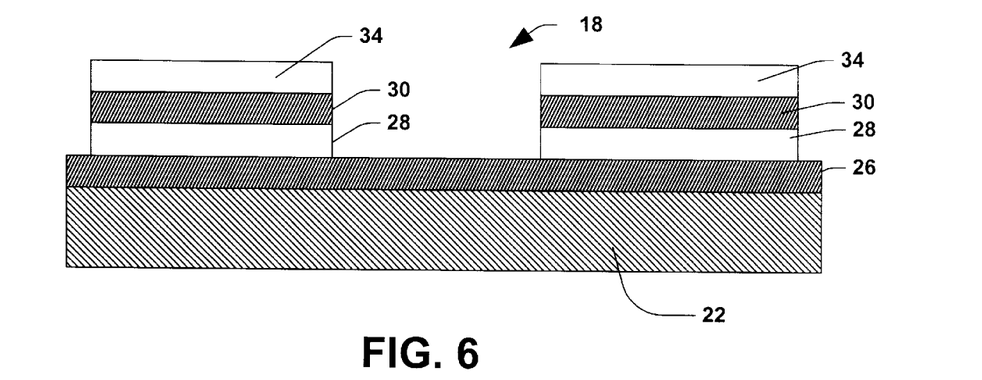
Figure 7:
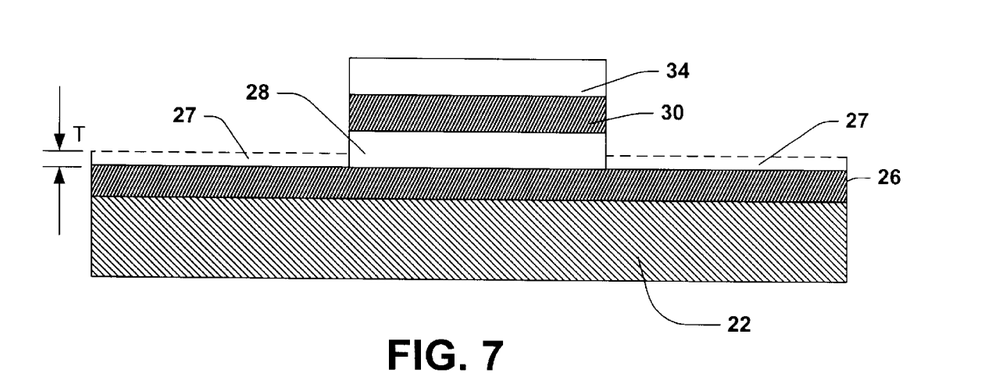
Figure 8:
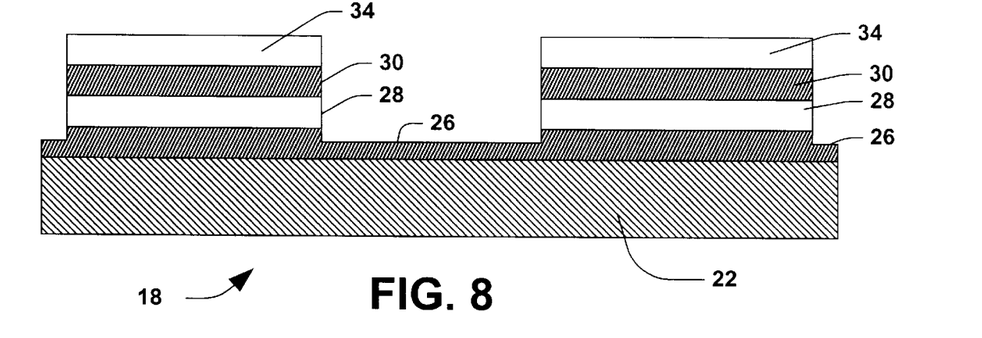

In one embodiment, the isotropic etch is performed on nitride layer 28 to selectively removes the unmasked portion of nitride layer 28, as illustrated in FIGS. 6–8. In one embodiment, gas 55 includes a gas mixture that has a high nitride to oxide selectivity, such as between about 20 and 60 sccm of $NF_3$ and between about 200 and 600 sccm of Helium. Preferably, the nitride to oxide selectivity is between about 3 and 8, and more preferably about 7, to selectively remove the unmasked portion of nitride layer 28 without removing a substantial portion of the first oxide layer 26. A substantial portion of first oxide layer 26 is defined herein as a portion 27 of first oxide layer 26 having a thickness T of more than 100 angstroms, as illustrated in FIG. 7. Preferably, the isotropic etch selectively removes the nitride layer 28 and a portion 27 of first oxide layer 26 having a thickness T of no more than 0 to 40 angstroms. The gas mixture is converted to low energy plasma 56. A power of between about 10 W and 50 W is applied to the RF coil 54 and the paddle 58 is heated to a temperature of between about 40° C. and about 100° C. In one embodiment, gas 55 includes $NF_3$ and Helium to selectively remove the unmasked portion of nitride layer 28. Preferably, gas 55 includes between about 20 and 60 sccm of $NF_3$ and between about 200 and 600 sccm of Helium at a pressure of between about 600 and 1400 mT, and more preferably about 40 sccm of $NF_3$ and about 300 sccm of Helium at a pressure of about 800 mT. Preferably, the isotropic etch selectively removes the unmasked portion of nitride layer 28 and penetrates between 0 and 40 angstroms of first oxide layer 26. By using an isotropic etch, the method described above is able to selectively remove the unmasked portion of nitride layer 28 with little or no damage to the semiconductor substrate 22 below the first oxide layer 26, since the isotropic etch penetrates less than 40 angstroms of the first oxide layer 26.

In one embodiment, after patterning resist layer 36 and forming patterned resist layer 34, a wet etch is performed on the second oxide layer 30 to selectively remove the unmasked portion of the second oxide layer 30, as illustrated in FIG. 5. Preferably, the wet etch is a wet etch that is highly selective to oxides, such as a buffered oxide etch, or a diluted hydrofluoric acid etch. In one embodiment, a buffered oxide etch which is between about 30 and 50 parts $NH_4F$, and more preferably about 40 parts $NH_4F$, to every one part of hydrofluoric acid or dilute hydrofluoric acid. This allows a very high selectivity of oxide to nitride, that is a selectively that is at least about 30:1. While the removal of the unmasked portion of the second oxide layer 30 has been described with respect to a wet etch or an isotropic etch, any other type of etch or means for selectively removing the unmasked portion of the second oxide layer 30 known by those skilled in the art may also be used to remove the unmasked portion of the second oxide layer 30. The above described method allows removal of the nitride layer 28 without removal of the patterned resist layer 34, without damaging the underlying semiconductor substrate 22, and without removing a substantial portion of the first oxide layer 26.

Upon removing the unmasked portion of the nitride layer 28, the unmasked portion of the first oxide layer 26 may be removed, or the unmasked portion of the first oxide layer 26 may remain intact, depending on the type of semiconductor device 18 being fabricated. In one embodiment, the unmasked portion of the first oxide layer 26 remains intact upon removing nitride layer 28, as illustrated in FIG. 8.

Figure 9:
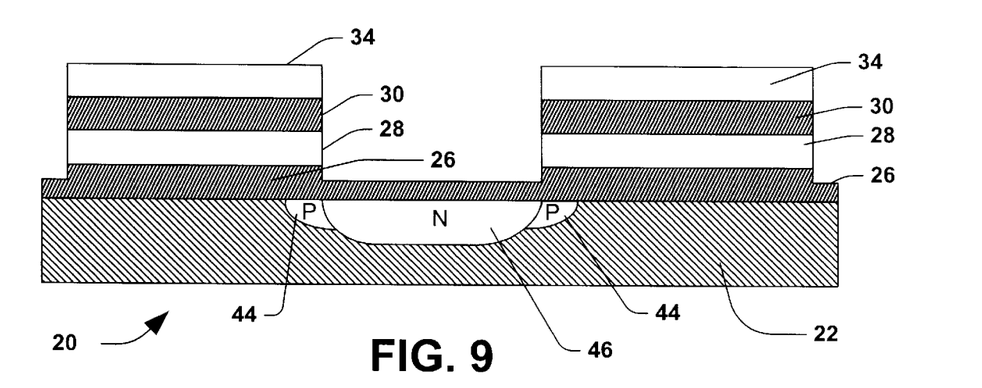
FIGS. 9–11 illustrate, in cross-section, process steps for the fabrication of a memory cell having an ONO layer, in accordance with one preferred embodiment of the invention.
Figure 10:
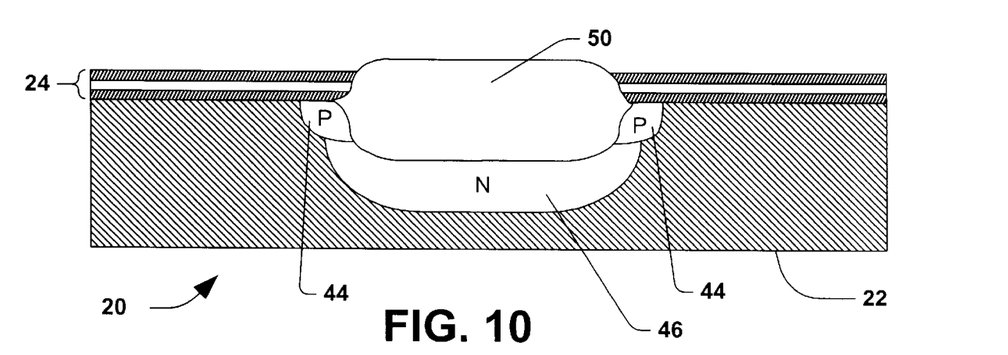
Figure 11:
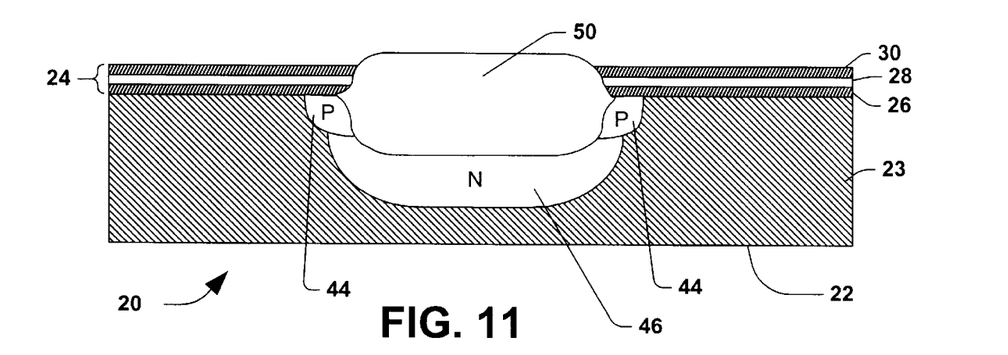

Shown in FIGS. 9–11, in cross-section, are process steps for the fabrication of a memory device 20 having an ONO layer 24, in accordance with one preferred embodiment. Please note that FIGS. 9–11 illustrate only a portion of memory device 20 showing only one complete memory cell, in cross-section. A non-volatile memory device, such as memory device 20, may have many memory cells. For the sake of clarity, these additional memory cells have been left out of FIGS. 9–11.

Memory device 20 includes p-type regions 44 and n-type regions 46 located in semiconductor substrate 22 and separated by a channel region 23, as illustrated in FIG. 11. Bit-line oxide region 50 overlies p-type regions 44 and n-type regions 46, respectively. In the operation of memory device 20, data resides in a certain logic state on memory device 20. During a read operation, selected data from a selected memory cell within memory device 20 can be output to an external communication unit by using n-type regions 46. Those skilled in the art will recognize that in order to create a higher density memory device 20, ONO layer 24 must be formed with great accuracy. In one embodiment, ONO layer 24 is formed and a portion of ONO layer 24 is removed, as described above and in FIGS. 1–8.

Upon removing a portion of ONO layer 24, semiconductor substrate 22 is doped with a p-type dopant, as illustrated in FIG. 9. In one preferred embodiment of this invention, semiconductor substrate 22 is doped with a p-type dopant by using ion implantation. Preferably, p-type dopant comprises boron. Using the patterned resist layer 34 as an ion implant mask, a p-type implant is performed to fix the threshold voltage and enhance hot carrier programming of the selected transistor, as illustrated in FIG. 9. The p-type implant is preferably boron implanted at a dose of about $1 \times 10^{12}$ cm$^{-2}$ to about $1 \times 10^{14}$ cm$^{-2}$ at an implant energy of about 20 KeV to about 80 KeV. In one preferred embodiment, the p-type implant is performed directly onto semiconductor substrate 22, but is masked out by resist mask 34. Preferably, the p-type implant is an angled implant, that is, an implant at an angle acute with respect to the principal surface of the semiconductor substrate. Preferably, the p-type implant can be performed at an angle of about 10° to about 85° with respect to principal surface 38 of the semiconductor substrate 22.

After doping semiconductor substrate 22 with a p-type dopant, semiconductor substrate 22 is then doped with an n-type dopant. Preferably, patterned resist layer 34 is used as a doping mask for the n-type dopant implant, as illustrated in FIG. 9. Preferably, n-type dopant comprises an element selected from the group consisting of antimony, arsenic, and phosphorus. Preferably, semiconductor substrate 22 is doped with arsenic. In one preferred embodiment of this invention, the semiconductor substrate 22 is doped with an n-type dopant, such as arsenic, by using ion implantation. Ion implantation allows for the fabrication of memory device 20 with higher density and smaller feature sizes. Using patterned resist layer 34 as an ion implant mask, n-type dopant implant is then performed. The n-type implant is preferably arsenic implanted at a dose of about $1 \times 10^{4}$ cm$^{-2}$ to about $1 \times 10^{16}$ cm$^{-2}$ at an implant energy of about 20 KeV to about 80 KeV. The n-type dopant implant provides a high breakdown voltage for the drain node, which is needed for erasing the contents of a memory device 20. The n-type implant 60 also forms the buried bit-line, which is a sub-surface conductive channel that carries a signal to each bit in the memory device 20.

Once semiconductor substrate 22 has been doped with n-type and p-type dopants, patterned resist layer 34 is stripped and cleaned from ONO layer 24 and bit-line oxide region 50 is formed overlying the semiconductor substrate 22, as illustrated in FIG. 10. Bit-line oxide region 50 is preferably formed by thermally growing a layer of silicon dioxide into and on top of the semiconductor substrate 22.

Thus, there has been disclosed in accordance with the invention, a process for fabricating a semiconductor device that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A process for fabricating a semiconductor device comprising:

providing a semiconductor substrate having an oxide-nitride-oxide layer thereon and a patterned resist layer overlying the oxide-nitride-oxide layer, wherein the oxide-nitride-oxide layer includes a first oxide layer, a nitride layer overlying the first oxide layer, and a second oxide layer overlying the nitride layer; and performing an isotropic etch on the oxide-nitride-oxide layer to remove a portion of the oxide-nitride-oxide layer, wherein the isotropic etch is performed on the second oxide layer, the nitride layer, and a portion of the first oxide layer, wherein performing the isotropic etch further comprises:

placing the semiconductor substrate in a process chamber;

inductively coupling RF power to a plasma chamber containing fluorine gas to generate a fluorine based plasma;

diffusing the fluorine based plasma into the process chamber, wherein the fluorine based plasma etches, the oxide-nitride-oxide layer in an isotropic manner.

2. The process of claim 1, wherein the isotropic etch is performed on the second oxide layer and comprises:

placing the semiconductor substrate on a paddle in the process chamber, wherein a temperature of the paddle is about 40° C. or more and about 100° C. or less; and inductively coupling RF power to the plasma chamber with an energy of about 50 W or more and about 100 W or less.

3. The process of claim 2, wherein the isotropic etch is further performed on the nitride layer and comprises:

maintaining the semiconductor substrate on the paddle in the process chamber; and inductively coupling RF power to the plasma chamber with an energy of about 10 W or more and about 50 W or less.

4. A process for fabricating a semiconductor device comprising:

providing a semiconductor substrate having an oxide-nitride-oxide layer thereon and a patterned resist layer overlying the oxide-nitride-oxide layer in a process chamber, wherein the oxide-nitride-oxide layer includes a first oxide layer, a nitride layer overlying the first oxide layer, and a second oxide layer overlying the nitride layer;

introducing a fluorine gas into a plasma chamber separate from the process chamber;

inductively coupling RF power to the fluorine gas to form a fluorine plasma in the plasma chamber;

diffusing the fluorine plasma into the process chamber;

performing a first isotropic etch on the second oxide layer using the fluorine plasma; and performing a second isotropic etch on the nitride layer, wherein the second isotropic etch is performed through an entire thickness of the nitride layer using the fluorine plasma.

5. The process of claim 4, wherein the first isotropic etch comprises:
   placing the semiconductor substrate on a paddle in the process chamber, wherein a temperature of the paddle is about 40C. or more and about 100C. or less; and
   inductively coupling RF power to the plasma chamber with an energy of about 50 W or more and about 100 W or less.

6. The process of claim 4, wherein the second isotropic etch comprises:
   maintaining the semiconductor substrate on the paddle in the process chamber; and
   inductively coupling RF power to the plasma chamber with an energy of about 10 W or more and about 50 W or less.

* * * * *

UNITED STATES PATENT AND TRADEMARK OFFICE
CERTIFICATE OF CORRECTION

PATENT NO.    : 6,500,768 B1 Page 1 of 1
DATED         : December 31, 2002
INVENTOR(S)   : Jeffrey A. Shields, Jiahua Huang and Jean Yee-Mei Yang It is certified that error appears in the above-identified patent and that said Letters Patent is hereby corrected as shown below:

<u>Column 10,</u>
Line 1, please replace the number "4" with the number -- 5 --.

Signed and Sealed this

Twenty-ninth Day of April, 2003

JAMES E. ROGAN
*Director of the United States Patent and Trademark Office*